(12) United States Patent
Wei (10) Patent No.: US 10,772,235 B2
(45) Date of Patent: Sep. 8, 2020

(54) HEAT SINK AND MANUFACTURING METHOD THEREOF

(71) Applicant: COOLER MASTER TECHNOLOGY INC., New Taipei (TW)

(72) Inventor: Yu-Te Wei, New Taipei (TW)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 64 days.

(21) Appl. No.: 15/622,944

(22) Filed: Jun. 14, 2017

(65) Prior Publication Data
US 2018/0168069 A1  Jun. 14, 2018

(30) Foreign Application Priority Data
Dec. 9, 2016 (TW) .............................. 105140952 A (51) Int. Cl.
| | |
|---|---|
| *H05K 7/20* | (2006.01) |
| *F28D 15/02* | (2006.01) |
| *H01L 23/367* | (2006.01) |
| *H01L 23/427* | (2006.01) |
| *B23P 15/26* | (2006.01) |
| *F28F 21/08* | (2006.01) |
| *G06F 1/20* | (2006.01) |

(52) U.S. Cl.
CPC .......... *H05K 7/20336* (2013.01); *B23P 15/26* (2013.01); *F28D 15/0233* (2013.01); *F28D 15/0275* (2013.01); *F28F 21/084* (2013.01); *G06F 1/20* (2013.01); *H01L 23/3672* (2013.01); *H01L 23/427* (2013.01); *B23P 2700/09* (2013.01)

(58) Field of Classification Search
CPC ...... H05K 7/20336; G06F 1/20; F28F 21/084; B23P 15/26; B23P 2700/09; H01L 23/427; H01L 23/3672; F28D 15/0275; F28D 15/0233
USPC ... 165/80.2, 80.3, 80.4, 185, 104.26, 104.33
See application file for complete search history.

(56) References Cited

U.S. PATENT DOCUMENTS 3,387,653 A * 6/1968 Coe .......................... F28F 1/12
                                                            165/165
4,266,603 A * 5/1981 Germann .............. F28D 7/0016
                                                            138/171

(Continued)

FOREIGN PATENT DOCUMENTS

| CN | 201750660 U | 2/2011 |
| CN | 202032928 U | 11/2011 |

*Primary Examiner* — Ljiljana V. Ciric
(74) *Attorney, Agent, or Firm* — Maschoff Brennan (57) ABSTRACT

A heat sink and its manufacturing method. The heat sink includes a base and plural heat pipes. The base has a first surface, plural parallel heated areas concavely formed on the first surface, a protrusion disposed between any two heated areas and protruding in a direction towards the first surface, and at least one notch formed on each protrusion. A first protrusion portion and a second protrusion portion are formed at the top of the protrusion and the top of notch respectively. The heat pipes are embedded into the heated areas respectively in the lengthwise direction, and the heat pipes at the notches of the protrusions are attached and in contact with each other. The notch of each heat pipe may be compressed and deformed, so that the heat pipes are in contact with each other.

18 Claims, 7 Drawing Sheets

(56) References Cited

U.S. PATENT DOCUMENTS

| | | | | |
|---|---|---|---|---|
| 5,539,857 A * | 7/1996 | McGrevy | B29C 45/2738 | 219/536 |
| 5,829,516 A * | 11/1998 | Lavochkin | F28F 1/22 | 165/80.4 |
| 5,960,866 A * | 10/1999 | Kimura | F28D 15/0233 | 165/104.19 |
| 5,983,995 A * | 11/1999 | Shutou | B23P 11/00 | 165/104.33 |
| 6,853,555 B2 * | 2/2005 | Fichera | H01L 23/473 | 165/80.4 |
| 7,036,566 B1 * | 5/2006 | Huang | F28D 15/0266 | 165/104.21 |
| 7,441,592 B2 * | 10/2008 | Huang | H01L 23/3677 | 165/104.21 |
| 7,543,960 B2 * | 6/2009 | Chang | B82Y 10/00 | 362/294 |
| 7,600,558 B2 * | 10/2009 | Chen | H01L 23/427 | 165/104.33 |
| 7,891,414 B2 * | 2/2011 | Cheng | F28D 15/0275 | 165/104.33 |
| 8,132,615 B2 * | 3/2012 | Lin | H01L 23/427 | 165/104.21 |
| 8,322,403 B2 * | 12/2012 | Lin | F28D 15/0233 | 165/80.2 |
| 8,555,952 B2 * | 10/2013 | Huang | F28F 3/02 | 165/80.3 |
| 8,746,325 B2 * | 6/2014 | Huang | F28D 15/0275 | 165/80.2 |
| 8,806,748 B2 * | 8/2014 | Huang | F28D 15/0275 | 29/437 |
| 2005/0195569 A1 * | 9/2005 | Hsu | H01L 23/3672 | 361/697 |
| 2006/0011329 A1 * | 1/2006 | Wang | F28D 15/0233 | 165/104.33 |
| 2006/0181848 A1 * | 8/2006 | Kiley | H01L 23/427 | 361/697 |
| 2006/0278374 A1 * | 12/2006 | Hao | H01L 23/427 | 165/104.33 |
| 2006/0289150 A1 * | 12/2006 | Lee | H01L 23/427 | 165/104.33 |
| 2007/0097644 A1 * | 5/2007 | Lu | H01L 23/467 | 361/700 |
| 2007/0215327 A1 * | 9/2007 | Lai | H01L 23/467 | 165/104.33 |
| 2007/0267181 A1 * | 11/2007 | Lin | F28D 15/0266 | 165/104.33 |
| 2008/0314555 A1 * | 12/2008 | Wu | F28D 15/0266 | 165/80.3 |
| 2009/0084528 A1 * | 4/2009 | Cheng | F28D 15/0275 | 165/104.33 |
| 2009/0120611 A1 * | 5/2009 | Shen | F28D 15/0275 | 165/80.3 |
| 2009/0178787 A1 * | 7/2009 | Huang | H01L 23/427 | 165/104.33 |
| 2009/0194255 A1 * | 8/2009 | Huang | G06F 1/20 | 165/80.3 |
| 2009/0229789 A1 * | 9/2009 | Lu | F28D 15/02 | 165/80.3 |
| 2009/0229790 A1 * | 9/2009 | Lu | F28D 15/02 | 165/80.3 |
| 2009/0266522 A1 * | 10/2009 | Lin | B21D 53/02 | 165/104.33 |
| 2010/0270007 A1 * | 10/2010 | Lin | F28D 15/0233 | 165/80.2 |
| 2011/0100609 A1 * | 5/2011 | Tang | H05K 7/20309 | 165/104.26 |
| 2011/0290449 A1 * | 12/2011 | Huang | F28F 1/325 | 165/104.26 |
| 2012/0043057 A1 * | 2/2012 | Wu | F28D 15/0275 | 165/104.26 |
| 2012/0103563 A1 * | 5/2012 | Leu | H01L 23/427 | 165/67 |
| 2012/0205084 A1 * | 8/2012 | Huang | G06F 1/203 | 165/181 |
| 2012/0222839 A1 * | 9/2012 | Huang | F28D 15/0233 | 165/104.26 |
| 2012/0222840 A1 * | 9/2012 | Huang | F28D 15/0275 | 165/104.26 |
| 2013/0043006 A1 * | 2/2013 | Peng | H01L 23/427 | 165/104.26 |
| 2014/0347801 A1 * | 11/2014 | Qin | G06F 1/1635 | 361/679.12 |
| 2015/0285482 A1 * | 10/2015 | Wang | F21V 29/51 | 165/104.21 |
| 2017/0102186 A1 * | 4/2017 | Huang | F28D 15/0275 | |
| 2017/0153065 A1 * | 6/2017 | Lan | F28F 1/32 | |

* cited by examiner

HEAT SINK AND MANUFACTURING METHOD THEREOF

CROSS-REFERENCE TO RELATED APPLICATIONS

This non-provisional application claims priority under 35 U.S.C. § 119(a) on Patent Application No(s). 105140952 filed in Taiwan, R.O.C. on Dec. 9, 2016, the entire contents of which are hereby incorporated by reference.

FIELD OF THE INVENTION

This disclosure relates generally to a heat dissipation technology, and more particularly to a parallel heat-pipes type heat sink and its manufacturing method.

BACKGROUND OF THE INVENTION

In general, a component such as a heat pipe is added to the bottom of a heat sink to improve the thermal conduction effect. For example, a groove is concavely formed on a base of the heat sink, and then the heat pipe with an appropriate length is embedded into the groove, so that the heat pipe is contacted directly with a heat source such as a central processing unit (CPU) to achieve a better thermal conduction effect.

However, the quantity of heat pipes will determine the thermal conduction effect, so that the quantity of heat pipes is increased according to size of the contact area with the heat source. In a conventional structure for embedding the heat pipes, or directly embedding the heat pipes into the base of the heat sink, the bonding strength is insufficient. In order to embed the heat pipes securely, additional structures are added between the heat pipes, and such arrangement reduces the thermal conduction effect significantly.

P.R.C. Pat. No. CN201750660U has disclosed a "Heatpipe heat sink" comprising a plurality of grooves formed on a base of a heat sink, partially coupled next to one another, and provided for installing a plurality of heat pipes. Since the grooves are arranged adjacent to one another, therefore the grooves lose its function of fixing the heat pipes significantly, and it is necessary to solder the heat pipes into the grooves by a solder such as a solder paste. As a result, the heat pipes may fall out easily or have poor thermal conduction due to poor soldering, and the complicated manufacturing process may lower the yield rate of the product.

P.R.C. Pat. No. CN202032928U has disclosed a "Thermally conducting base assembly for arranging heat pipes closely" and the assembly comprises a plurality of spaced grooves formed on a thermally conducting base, a supporting rib formed between the grooves, and each supporting rib has a protruding rib disposed at the top edge and protruding towards the inner side of the groove, and the protruding rib will be embedded into a deformation portion of the heat pipe after the heat pipe is compressed and deformed, so as to achieve the effect of fixing each heat pipe. However, most bases are formed by aluminum extrusion, so that the uniformity of the rib at the top edge of the supporting rib cannot be controlled easily. If the protruding rib is too small, the heat pipe may fall out easily. If the protruding rib is too large, the heat pipe will be damaged easily when compressed. A large gap between the heat pipes occurs very often, so that the compressed heat pipes fail to form a heated surface with their adjacent heat pipes, and the thermal conduction efficiency will be very low.

In view of the aforementioned drawbacks of the prior art, the discloser of this disclosure based on years of experience in the related industry to conduct extensive research, and experiment, and finally provided a feasible and effective solution in accordance with this disclosure to overcome the drawbacks of the prior art.

SUMMARY OF THE INVENTION

Therefore, it is a primary objective of the present invention to provide a heat sink and its manufacturing method, wherein a base of the heat sink is provided for embedding a plurality of heat pipes, and the bonding strength is good and the heat pipes are closely attached and contacted in contact with one another, particularly to the major heated portion.

To achieve the aforementioned and other objectives, this disclosure provides a heat sink, comprising a base, and a plurality of heat pipes; wherein the base has a first surface, a plurality of parallel heated areas concavely formed on the first surface, a protrusion disposed between any two heated areas and protruded in a direction towards the first surface, and at least one notch formed at any one section of each protrusion, and each heat pipe being embedded into each heated area in a lengthwise direction, and the notches of the protrusions of the heat pipes are attached and contacted with one another. The notch of each heat pipe may be compressed and deformed, so as to provide good contact, thermal conduction, and bonding strength.

To achieve the aforementioned and other objectives, this disclosure further provides a heat sink, comprising a base, and a plurality of heat pipes; wherein the base has a first surface, a plurality of parallel heated areas concavely formed on the first surface, a protrusion disposed between any two heated areas and protruding in a direction towards the first surface, and each protrusion comprising a first protrusion portion and a second protrusion portion, wherein there is a height difference between the first protrusion portion and the second protrusion portion, and the heat pipes are embedded into the heated areas respectively in the lengthwise direction, and each heat pipe is connected to the other heat pipe at the top of at least one second protrusion portion.

Figure 8:
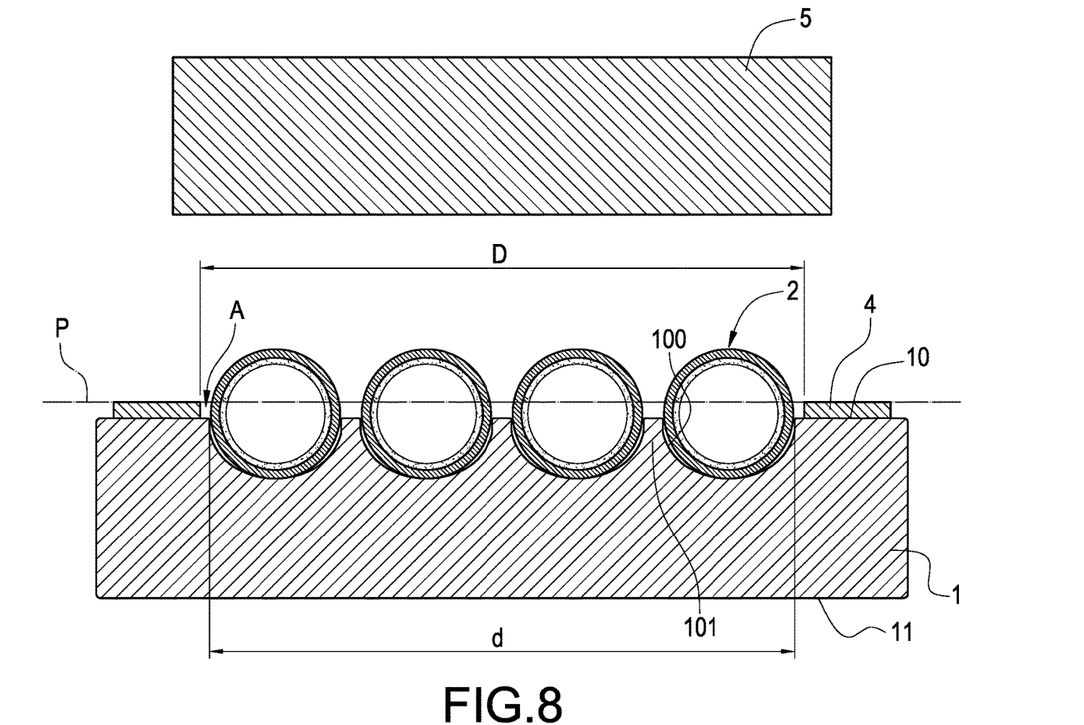
FIG. 8 is a schematic view showing a manufacturing process of a further preferred embodiment of this disclosure.

To achieve the aforementioned and other objectives, this disclosure further provides a manufacturing method of a parallel heat-pipes type heat sink comprising the steps of: (a) preparing a base (1) having a first surface (10), a plurality of parallel heated areas (100) concavely formed on the first surface (10), a protrusion (101) disposed between any two heated areas (100) and protruding in a direction towards the first surface (10), and a notch (102) formed at any one section of each protrusion (101); (b) preparing a limiting fixture (4) and a plurality of heat pipes (2), and the limiting fixture (4) being positioned on the first surface (10) of the base (1) to define a press plane (P) and a deformation limiting area (A), and the heat pipes (2) being embedded into the heated areas (100) respectively in the lengthwise direction of each heat pipe (2), wherein the width of the deformation limiting area (A) arranged in the side-by-side direction of each heat pipe (2) is greater than or equal to the sum of distances of all heat pipes (2) arranged parallel to one another in the heated areas (100); (c) applying a press process to the heat pipes (2), so that the heat pipes (2) are embedded into the heated areas (100) respectively, and a heated surface (20) is formed within the range of a deformation limiting area (A) and coplanar with the press plane (P).

DESCRIPTION OF THE PREFERRED EMBODIMENTS

The technical contents of the present invention will become apparent with the detailed description of preferred embodiments accompanied with the illustration of related drawings as follows. It is noteworthy that the preferred embodiments are provided for illustrating this disclosure rather than restricting the scope of the disclosure.

Figure 1:
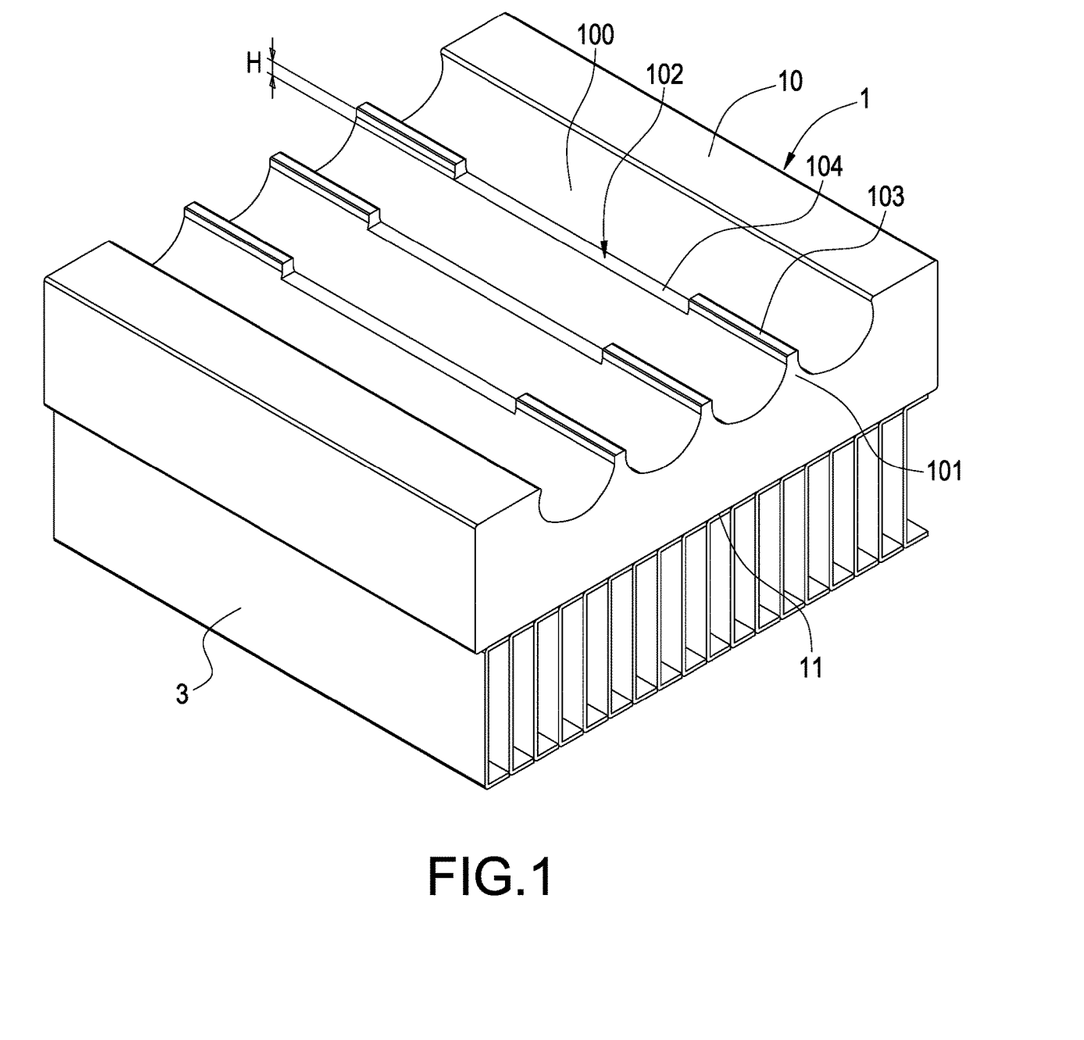
FIG. 1 is a perspective view of a base in accordance with this disclosure.
Figure 2:
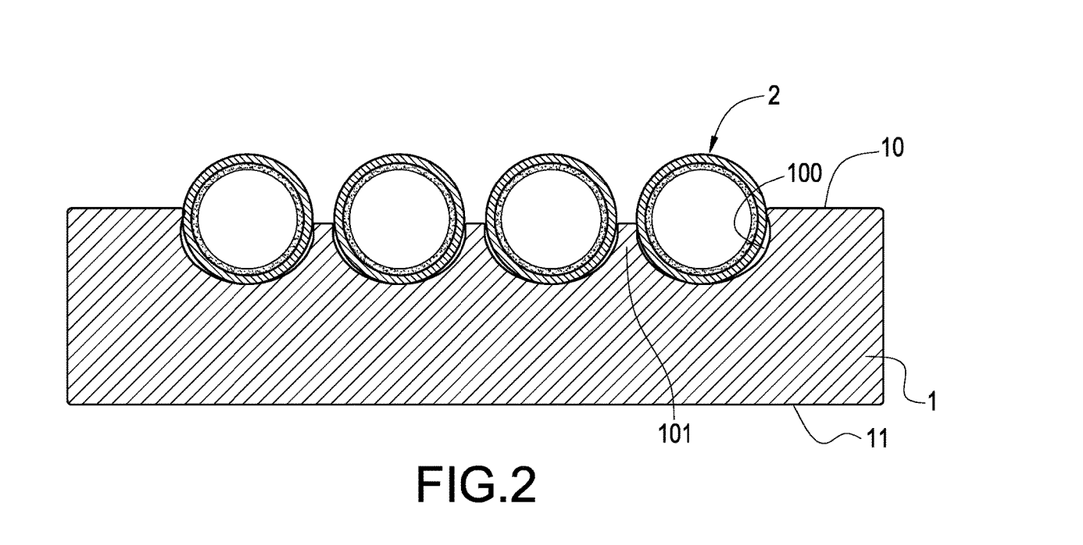
FIG. 2 is a first cross-sectional view of a base provided for installing heat pipes in accordance with this disclosure.
Figure 3:
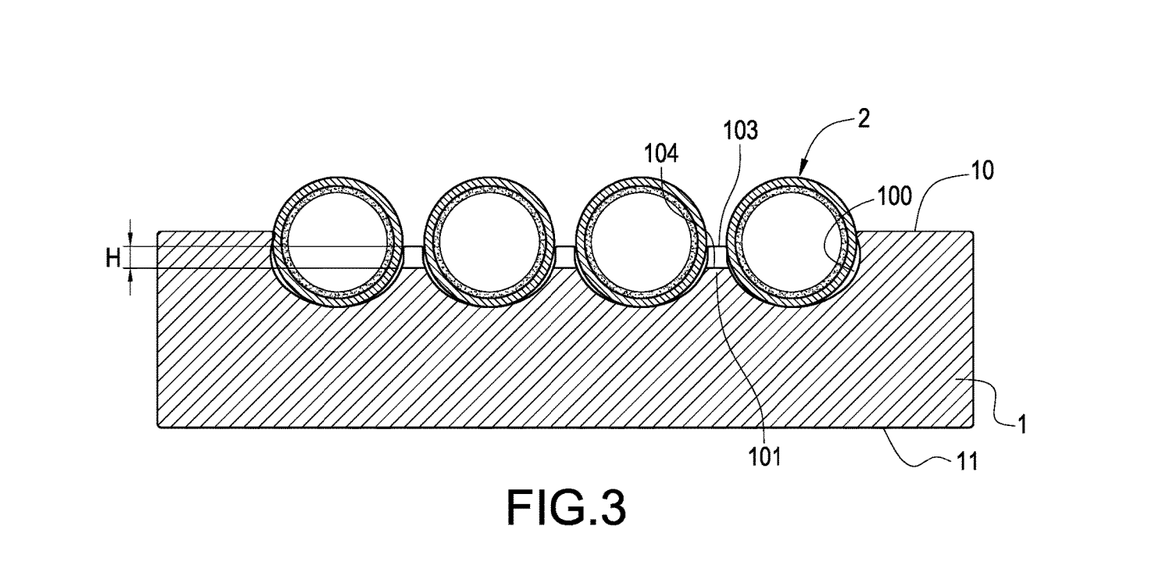
FIG. 3 is a second cross-sectional view of a base provided for installing heat pipes in accordance with this disclosure.

With reference to FIGS. 1 to 3 for a perspective view of a base, a cross-sectional views of the base for installing heat pipes in accordance with a preferred embodiment of this disclosure respectively, this disclosure provides a heat sink and its manufacturing method, and the heat sink comprises a base 1, and a plurality of heat pipes 2.

Figure 10:
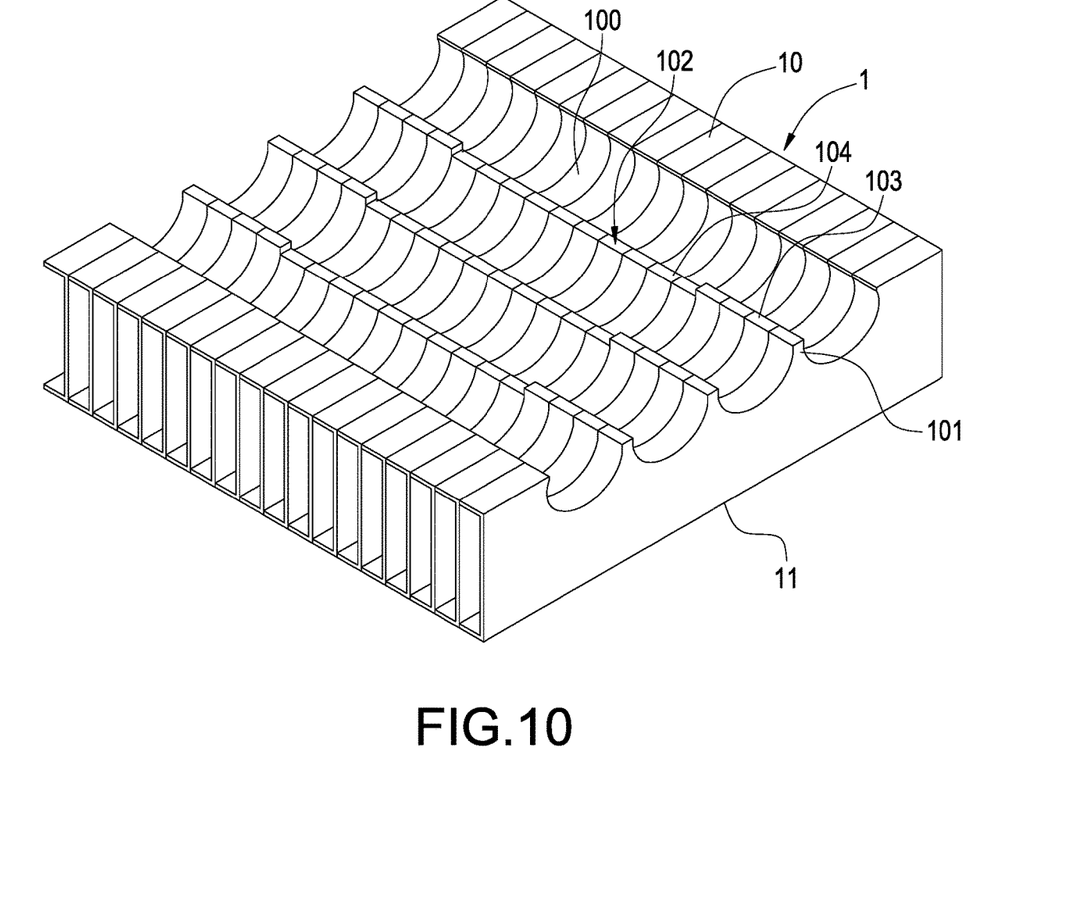
FIG. 10 is a perspective view of a base in accordance with another preferred embodiment of this disclosure.

The base 1 is a thermally conducting base made of a good thermal conductor such as copper or aluminum, or formed by stacking a plurality of fins (as shown in FIG. 10), and may be attached onto a heat source (not shown in the figure) like a heat sink. In a preferred embodiment of this disclosure, the base 1 has a first surface 10, and a second surface 11 opposite to the first surface 10 (in other words, the tap second surface 11 is disposed on the opposite side of the first surface 10), and the first surface 10 of the base 1 may be used to attach the aforementioned heat source, and the second surface 11 of the base 1 further comprises a plurality of spaced fins 3.

This disclosure primarily forms a plurality of long-strip heated area 100 on the first surface 10 of the base 1 for embedding the heat pipes 2 into the heated areas 100 respectively. In addition, the heated areas 100 are arranged parallel to one another, and a protrusion 101 is disposed between any two heated areas 100 and protrudes in a direction towards the first surface, and the protrusion 101 is extended in the lengthwise direction along the heated areas 100, and at least one notch 102 is formed at any section of each protrusion 101, and a first protrusion portion 103 is formed at the highest position of the protrusion 101 other than the position of the notch, and a second protrusion portion 104 is formed at the highest position of the notch 102 of the protrusion 101, and there is a height difference H between the first protrusion portion 103 and the second protrusion portion 104, wherein the height difference H is not non-zero, so that the height at the second protrusion portion 104 of the notch 102 of the protrusion 101 is lower in order to communicate two adjacent heated areas 100. In a preferred embodiment of this disclosure, the notch 102 is situated at the middle section of each protrusion 101, but the invention is not just limited to such arrangement only. In the press process, a displacement at the position of each heat pipe 2 with respect to the position of the protrusion 101 without the notch 102 can be prevented. In the meantime, the position of each heat pipe 2 with respect to the notch 102 is attached and contacted properly due to compression and deformation, so as to provide good thermal conduction and bonding strength.

Figure 4:
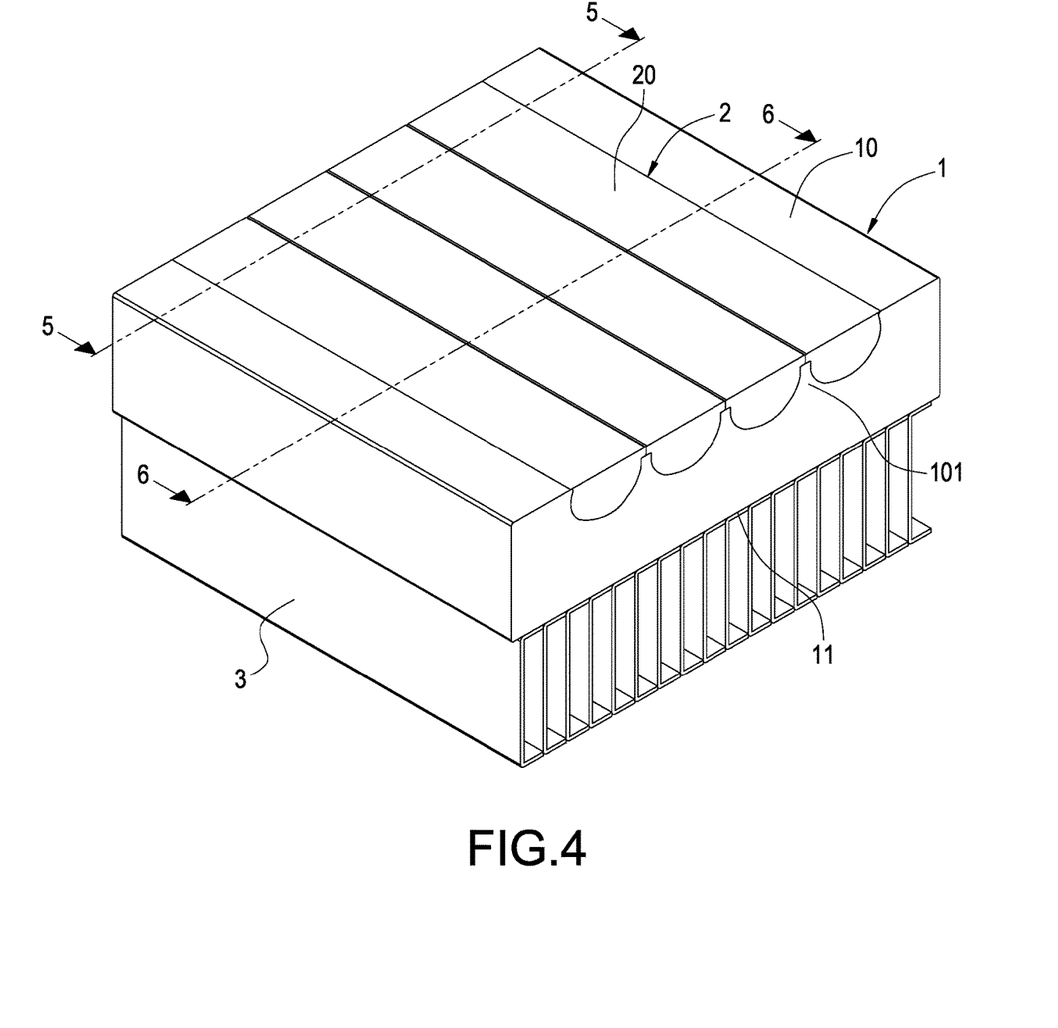
FIG. 4 is a perspective view of a base provided for embedding heat pipes in accordance with this disclosure.

With reference to FIGS. 2 to 4, when each heat pipe 2 is embedded into each respective heated area 100 in the lengthwise direction of the heat pipe 2, each heat pipe 2 at a position with respect to each heated area 100 (as shown in FIG. 2) is limited by the shape of each heated area 100, so that each heat pipe 2 is combined closely with each heated area 100 in the pressing and embedding processes. In the meantime, each heat pipe 2 at the position with respect to the notch 102 (as shown in FIG. 3) is laterally communicated with one another since the height of the second protrusion portion 104 of the notch 102 is lower than the first protrusion portion 103 of the protrusion 101 and the heated area 100 can communicate with one another. Therefore, a deformation portion 23 is formed at the top of the second protrusion portion 104 of the notch 102 in the process of pressing and embedding each heat pipe 2 to fill the notch 102, and any two adjacent heat pipes 2 are attached and contacted in contact with each other (as shown in FIG. 4), and each heat pipe 2 can have a good bonding strength with the base 1 and a good thermal conduction.

Figure 5:
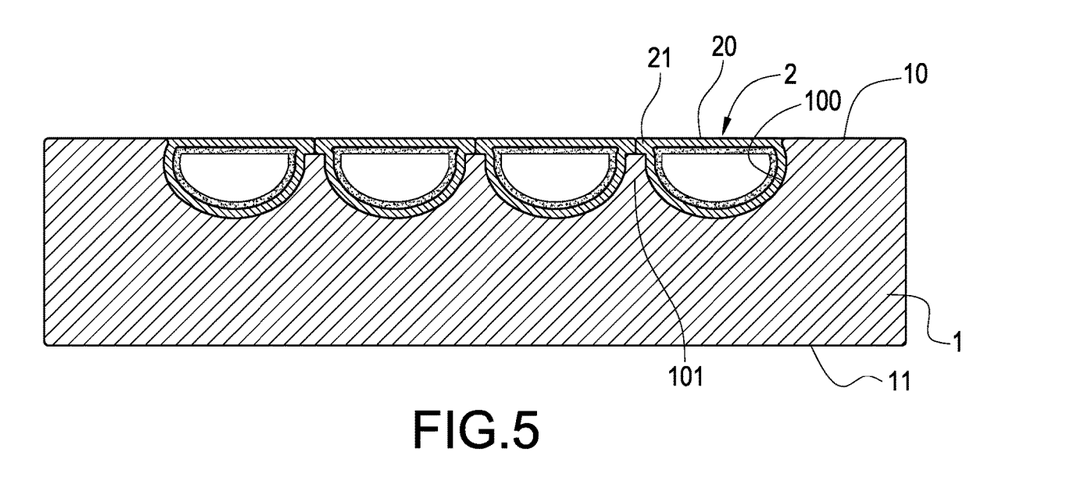
FIG. 5 is a cross-sectional view of Section 5-5 of FIG. 4.
Figure 6:
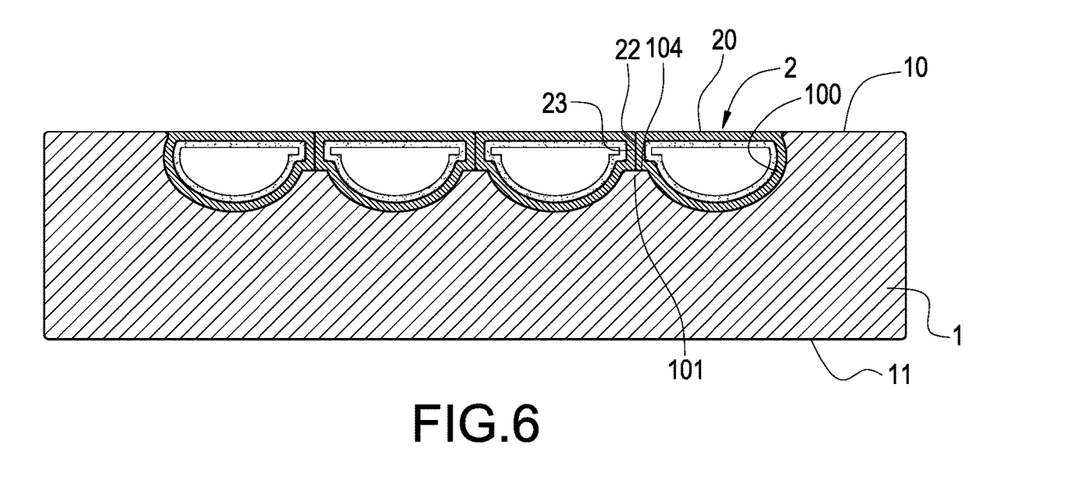
FIG. 6 is a cross-sectional view of Section 6-6 of FIG. 4.

More specifically, in FIG. 4, when each heat pipe 2 is pressed and embedded into the heated area 100, each heat pipe 2 has a heated surface 20 formed thereon and aligned exactly with the first surface 10 of the base 1 or slightly protruded. In FIG. 5, each heat pipe 2 with respect to the position of the protrusion 101 without the notch 102 may be deformed along the protrusion 101 since the height of the protrusion 101 is slightly lower than each heat pipe 2, and a connecting portion 21 extends from the heat pipe and abutted with another connecting portion 21, so that the heated surfaces 20 form a common plane. In FIG. 6, each heat pipe 2 with respect to the position of the notch 102 has a smaller spacer since the second protrusion portion 104 of the notch 102 is lower than the first protrusion portion 103 of the protrusion 101, so that each heat pipe 2 pressed and deformed between the deformation portions 23 is substantially limited by an external pressing force and an irregular deformation occurs. Therefore, the area of the contact surface 22 is increased, and the heat pipes 2 have better thermal conduction and bonding strength.

Figure 7:
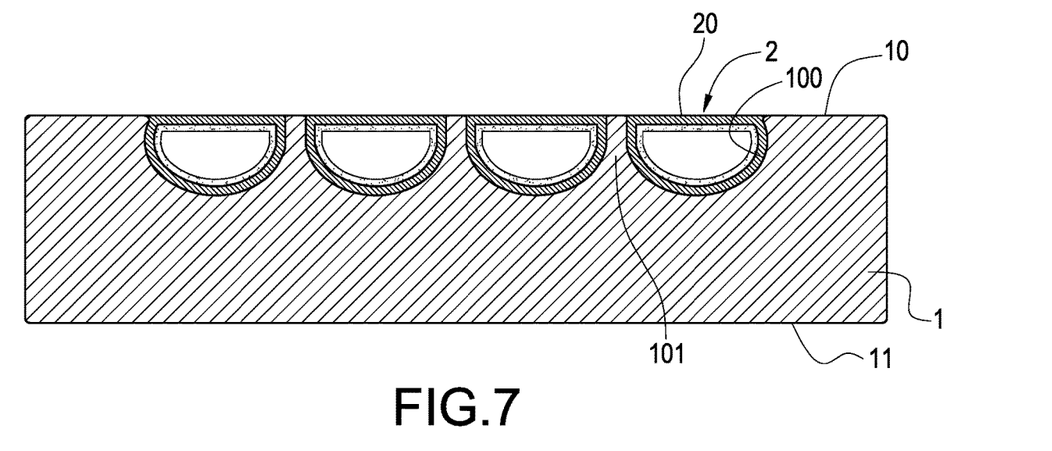
FIG. 7 is a cross-sectional view of Section 5-5 in accordance with another preferred embodiment of this disclosure.

In FIG. 7, the protrusion 101 may be aligned exactly with the first surface 10 of the base 1, so that the heat pipes 2 are in contact with each other at the position with respect to the notch 102 only to form the contact surface 22 but not the connecting portion 21.

Figure 9:
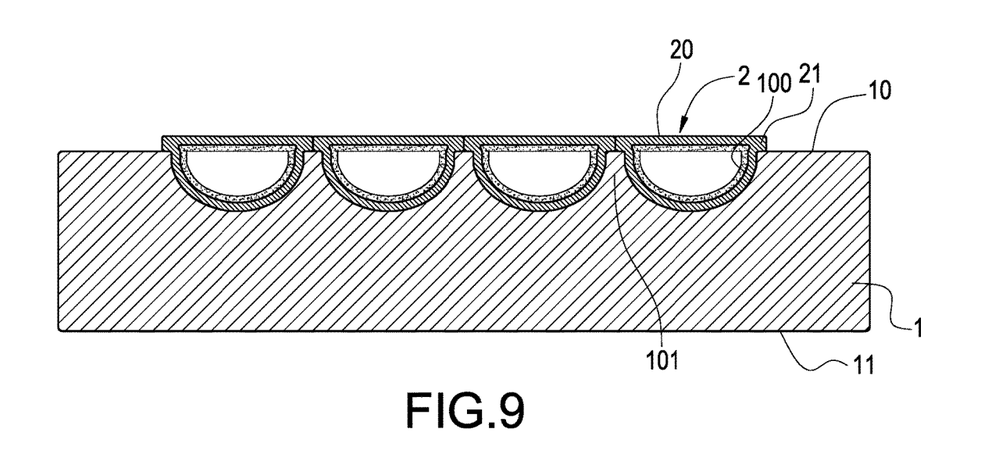
FIG. 9 is a cross-sectional view of a further preferred embodiment of this disclosure.

In FIGS. 8 and 9, the heated surface 20 of each heat pipe 2 is protruded out from the first surface 10 of the base 1. The manufacturing method in accordance with this preferred embodiment is described below. Components such as the base 1 and the heat pipes 2 with the aforementioned technical characteristics are prepared first, and then the limiting fixture 4 is prepared, wherein the limiting fixture 4 is positioned on the first surface 10 of the base 1 to define a press plane P and a deformation limiting area A, and the width D of the deformation limiting area A arranged in the side-by-side direction of each heat pipe is greater than or equal to the sum of distances d of all heat pipes 2 arranged parallel to one another in the heated area 100, and then a press process of each heat pipe 2 is carried out by a press mold 5, and the press process may be a stamping, extrusion, or rolling process conducted by a press mold 5, so that a press plane P defined by the heated surface 20 of each heat pipe 2 as well as the limiting fixture 4 is pressed and formed by the press mold 5, and protruded out from the first surface 10 of the base 1.

With the aforementioned structure and assembly, the heat sink and its manufacturing method in accordance with this disclosure are accomplished.

Compared with the prior art, this disclosure allows the plurality of heat pipes to be embedded into the base of the heat sink to provide a good bonding strength and a direct contact for each heat pipe, particularly for the position corresponding to the major heated area. More specifically, this disclosure includes the notch 102 formed on each protrusion 101, so that after each heat pipe 2 is pressed, the notch 102 is provided to form the deformation portion 23, so that the irregular contact surface 22 can be formed on the top of the second protrusion portion 104 of the notch 102 of the protrusion 101 due to the deformation portion 23 of the heat pipe 2, the soldering is no longer required. This disclosure achieves the bonding effect and lowers the level of difficulty of the manufacturing process, and further prevents damages to the heat pipe 2 or difficulties of forming the base 1. This disclosure also provides a larger area of the heated surface 20 to improve the thermal conduction efficiency.

In summation of the description above, this disclosure achieves the expected effects, overcomes the drawbacks of the prior art, and complies with the patent application requirements, and thus is duly filed for patent application. While the invention has been described by means of specific embodiments, numerous modifications and variations could be made thereto by those skilled in the art without departing from the scope and spirit of the invention set forth in the claims.

What is claimed is:

1. A heat sink, comprising:
   a base, having a first surface, a plurality of parallel heated areas concavely formed on the first surface, a protrusion disposed between any two heated areas and protruding in a direction towards the first surface, and a notch formed at any one section of each protrusion; and
   a plurality of heat pipes, embedded into the heated areas respectively in the lengthwise direction of each heat pipe, and attached and in contact with one another at the position of the notch;
   wherein the base further has two lateral surfaces opposite to each other, the first surface and the two lateral surfaces respectively face different directions, the protrusion begins at one of the lateral surfaces of the base and extends continuously along the base below the notch so as to end at the other of the lateral surfaces of the base, and the notch is spaced apart from the two lateral surfaces of the base.

2. The heat sink of claim 1, wherein the base is made of a material selected from the group consisting of copper and aluminum.

3. The heat sink of claim 1, wherein the base is formed by stacking a plurality of spaced fins.

4. The heat sink of claim 1, wherein the opposite side of the first surface of the base further has a plurality of spaced fins.

5. The heat sink of claim 1, wherein the heat pipes together form a heated surface.

6. The heat sink of claim 5, wherein the heated surface of the heat pipes is aligned exactly with or relatively protruded from the-first surface of the base.

7. The heat sink of claim 1, wherein the heat pipes have contact surfaces in contact with one another at the notch.

8. The heat sink of claim 1, wherein each the protrusion is aligned exactly with the-first surface of the base.

9. The heat sink of claim 8, wherein the heat pipes are deformed along the protrusion and a connecting portion extends from each heat pipe, and the connecting portions are abutted with each other to define a common plane.

10. A heat sink, comprising:
    a base, having a first surface, a plurality of parallel heated areas concavely formed on the first surface, a protrusion disposed between any two heated areas and protruding in a direction towards the first surface, and each protrusion comprising a first protrusion portion and a second protrusion portion, wherein there is a height difference between the first protrusion portion and the second protrusion portion; and
    a plurality of heat pipes, embedded into the heated areas respectively in the lengthwise direction of each heat pipe, and the heat pipes in contact with one another at a top of the second protrusion portion;
    wherein the distance between a surface of the first protrusion portion and the first surface of the base in a first direction is smaller than a distance between a surface of the second protrusion portion and the first surface of the base in the first direction.

11. The heat sink of claim 10, wherein the base is made of a material selected from the group consisting copper and aluminum.

12. The heat sink of claim 10, wherein the base is formed by stacking a plurality of spaced fins.

13. The heat sink of claim 10, wherein the opposite side of the first surface of the base further has a plurality of spaced fins.

14. The heat sink of claim 10, wherein the heat pipes together form a heated surface.

15. The heat sink of claim 14, wherein the heated surface of the heat pipes is aligned exactly with or relatively protruded from the first surface of the base.

16. The heat sink of claim 10, wherein each of the heat pipes has a deformation portion formed at the top of the second protrusion portion, and the deformation portions have a contact surface.

17. The heat sink of claim 10, wherein each first protrusion portion is aligned exactly with the first surface of the base.

18. The heat sink of claim 17, wherein the heat pipes are deformed along the first protrusion portion, and a deformation portion extends from each heat pipe, and the deformed portions are abutted with each other to define a common plane.

* * * * *